US012674831B2

(12) United States Patent
Faddel Mohamed et al.

(10) Patent No.: US 12,674,831 B2
(45) Date of Patent: Jul. 7, 2026

(54) FAULT LOCATION DETECTION IN TAPPED POWER DISTRIBUTION LINES

(71) Applicant: ABB Schweiz AG, Baden (CH)

(72) Inventors: Samy Gamal Faddel Mohamed, Clayton, NC (US); Jacob Tyler Miscio, Raleigh, NC (US); Ari Kalevi Wahlroos, Vaasa (FI)

(73) Assignee: ABB Schweiz AG, Baden (CH)

( * ) Notice: Subject to any disclaimer, the term of this patent is extended or adjusted under 35 U.S.C. 154(b) by 439 days.

(21) Appl. No.: 18/348,178

(22) Filed: Jul. 6, 2023

(65) Prior Publication Data

US 2025/0012839 A1     Jan. 9, 2025

(51) Int. Cl.
G01R 31/08          (2020.01)
(52) U.S. Cl.
CPC ......... G01R 31/085 (2013.01); G01R 31/088 (2013.01)
(58) Field of Classification Search
CPC ............................ G01R 31/085; G01R 31/088
See application file for complete search history.

(56) References Cited

U.S. PATENT DOCUMENTS 6,879,917 B2 * 4/2005 Turner ................. G01R 31/085
                                                    361/81
7,472,026 B2 * 12/2008 Premerlani ............ G01R 27/18
                                                    340/3.43

9,476,931 B2   10/2016 Sun
11,327,105 B2   5/2022 George
2004/0167729 A1   8/2004 Saha et al.

FOREIGN PATENT DOCUMENTS

CN        105467277 B      4/2016
CN        110389282 A      10/2019
CN        113721115 A      11/2021
(Continued)

OTHER PUBLICATIONS

Altonen, J. & Wahlroos, A. : "Advancements in Fundamental Frequency Impedance Based Earth-Fault Location in Unearthed Distribution Networks," CIRED 19th International Conference on Electricity Distribution, Vienna 2007.

(Continued)

*Primary Examiner* — Catherine T. Rastovski
*Assistant Examiner* — Nyla Gavia
(74) *Attorney, Agent, or Firm* — McCarter & English, LLP

(57)          ABSTRACT

A method of detecting a location of a fault in a distribution line having a first and second terminal and a line segment disposed therebetween is provided. The method includes identifying synchronized voltage and current phasors at the first and second terminal prior to and during the fault, calculating equivalent sequence components for the voltage and current phasors, locating a virtual load point on the line segment, and calculating a voltage at the virtual load point. The method further includes calculating a compensated load current at the first and/or second terminal based on one or more of the current phasors prior to and/or after the fault, and calculating a distance from the virtual load point to the fault based on the voltage at the virtual load point, the compensated load current, and one or more of the equivalent sequence components to detect the location of the fault.

20 Claims, 8 Drawing Sheets

(56)     References Cited

FOREIGN PATENT DOCUMENTS

| EP | 1939638 | A1 | 7/2008 | |
| FI | 118492 | B | 11/2007 | |
| JP | 2008157940 | A | 7/2008 | |
| WO | WO-2019130071 | A1 * | 7/2019 | ............ H02H 7/263 |

OTHER PUBLICATIONS

"Distribution Automation Handbook Section 8.15 Impedance Based Fault Location," Power System Protection, Oct. 7, 2010, pp. 1-24, ABB Oy. Distribution Automation, Vaasa, Finland.

Reddy et al., A Novel Fault Classifier and Locator using One-End Current Spectrum and Minimal Synchronized Symmetrical Components for Transmission Lines. 2016 IEEE Annual India Conference (INDICON). 6 pages, Dec. 16-18, 2016.

European Search Report for Application No. 24186822.3, dated Nov. 28, 2024, 5 pages.

* cited by examiner

FAULT LOCATION DETECTION IN TAPPED POWER DISTRIBUTION LINES

BACKGROUND

The field of the disclosure relates to electric grids, and in particular, to detecting faults in distribution lines of electric grids.

Fast and accurate localization of line faults is critical to modern electrical distribution systems because it enhances the system reliability and helps to reduce downtime by correctly dispatching maintenance crews to the location of the fault, and clearing the source of the fault, as quickly as possible. Different fault location methods have been used previously, but each presents various levels of complexity and drawbacks. Thus, it would be desirable to improve upon locating faults in electrical distribution systems.

BRIEF DESCRIPTION

In one aspect, a fault detector for detecting a location of a fault in a tapped power distribution line having a first terminal, a second terminal and a line segment disposed therebetween is provided. The fault detector includes at least one processor configured to identify synchronized voltage phasors and current phasors at the first terminal and the second terminal prior to and during the fault, calculate equivalent sequence components for the voltage phasors and the current phasors, locate a virtual tap load point on the line segment, and calculate a voltage at the virtual tap load point based on one or more of the current phasors prior to the fault. The at least one processor is further configured to calculate a compensated load current at the first terminal and/or the second terminal based on one or more of the current phasors prior to and/or after the fault, and calculate a distance from the virtual tap load point to the fault based on the voltage at the virtual tap load point, the compensated load current, and one or more of the equivalent sequence components to detect the location of the fault.

In another aspect, a method of detecting a location of a fault in a tapped power distribution line having a first terminal, a second terminal, and a line segment disposed therebetween is provided. The method includes identifying synchronized voltage phasors and current phasors at the first terminal and the second terminal prior to and during the fault, calculating equivalent sequence components for the voltage phasors and the current phasors, locating a virtual tap load point on the line segment, and calculating a voltage at the virtual tap load point based on one or more of the current phasors prior to the fault. The method further includes calculating a compensated load current at the first terminal and/or the second terminal based on one or more of the current phasors prior to and/or after the fault, and calculating a distance from the virtual tap load point to the fault based on the voltage at the virtual tap load point, the compensated load current, and one or more of the equivalent sequence components to detect the location of the fault.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings.

Figure 1:
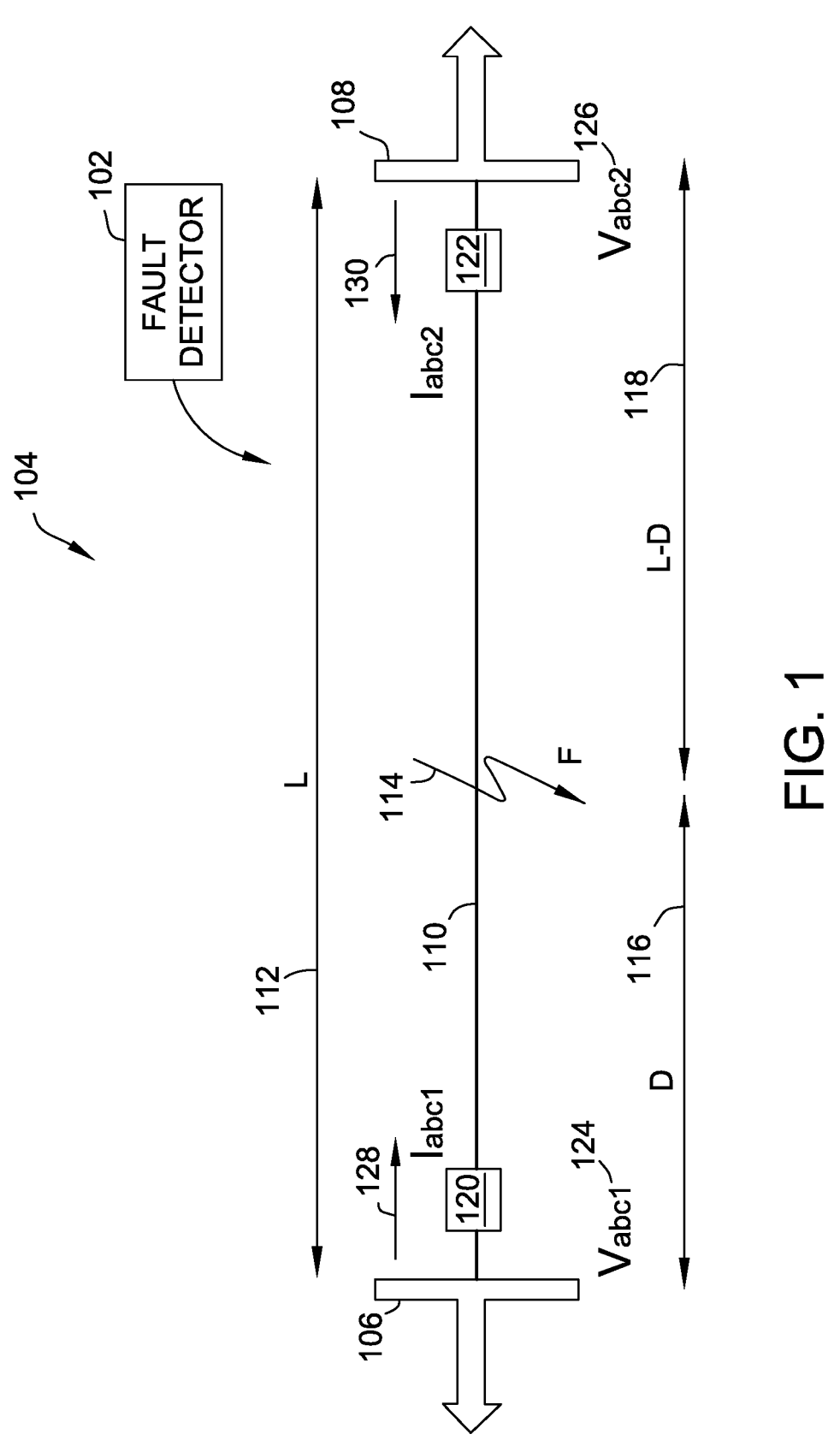
FIG. 1 depicts a fault detector for detecting a location of a fault in a distribution line in an exemplary embodiment.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, an analog computer, a programmable logic controller (PLC), an application specific integrated circuit (ASIC), and other programmable circuits, and these terms are used interchangeably herein. In the embodiments described herein, "memory" may include, but is not limited to, a computer-readable medium, such as a random-access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a touchscreen, a mouse, and a keyboard. Alternatively, other computer peripherals may also be used that may include, for example, but not be limited to, a scanner. Furthermore, in the example embodiment, additional output channels may include, but not be limited to, an operator interface monitor or heads-up display. Some embodiments involve the use of one or more electronic or computing devices. Such devices typically include a processor, processing device, or controller, such as a general-purpose central processing unit (CPU), a graphics processing unit (GPU), a microcontroller, a reduced instruction set computer (RISC) processor, an ASIC, a programmable logic controller (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are not intended to limit in any way the definition and/or meaning of the term processor and processing device.

As discussed briefly above, different fault location techniques have been previously used for locating faults in an electric grid, including single ended and double ended impedance-based methods.

Impedance-based methods are more commonly used in electrical distribution system due to their low cost, yet effective accuracy. Impedance-based fault location techniques use fundamental phasor measurements of voltages and currents at the ends of the distribution line, as well as the parameters of the distribution line. However, single ended impedance methods suffer from multiple sources of estimation errors and are inadequate for electrical distribution systems with distributed generation or meshed distribution topologies.

The embodiments describe herein provide a multi-ended impedance system and a method where synchronized measurements from two or more ends of the distribution line are identified. The main advantages of multi-ended impedance-based methods are their robustness against fault resistances, zero sequence impedance uncertainty, and system grounding, which are the main sources of inaccuracies in locating faults. The embodiments described herein are tailored for modern electrical distribution systems with distributed generation resources, and work for both radial and meshed/ring networks. The system and method described herein utilize knowledge of the synchronized voltages and currents at two or more ends of the distribution line as well as the positive sequence impedance of the distribution line. In some embodiments, these measurements may be obtained from the relays (or any other measurement devices) at the terminals of the distribution line, via timestamped value captures that can be accurate to a few microseconds. The system and method described herein consider the presence of tapped loads across the distribution line as well as the presence of distributed generation at the ends of the distribution line in order to accurately locate faults on the feeder.

FIG. 1 depicts a fault detector 102 for detecting a location of a fault in a distribution line 104 in an exemplary embodiment. In this embodiment, distribution line 104 includes a first terminal 106, a second terminal 108, and a line segment 110 disposed between first terminal 106 and second terminal 108. In this embodiment, first terminal 106 and second terminal 108 are separate by a distance (L) 112, and a fault (F) 114 is located in this embodiment at a distance (D) 116 from first terminal 106 and distance (L-D) 118 from second terminal 108. In this embodiment, distribution line 104 includes relays 120, 122.

In this embodiment, fault detector 102 measures, collects, and/or communicates with relays 120, 122 to identify voltage and current phasors at first terminal 106 and second terminal 108. In some embodiments fault detector 102 directly measures the voltage and/or current phasors at first terminal 106 and second terminal 108. In other embodiments, relays 120, 122 measure the voltage and/or current phasors at terminals 106, 108, and fault detector 102 communicates with relays 120, 122 to identify the voltage and current phasors measured at terminals 106, 108. In other embodiments, one or more voltage and current measurement systems and/or detection systems are implemented that measure and provide voltage and current phasor information at terminals 106, 108 to relays 120, 122 and/or fault detector 102. In this embodiment, the voltage phasor measured at first terminal 106 comprises $V_{abc1}$ 124, the voltage phasor measured at second terminal 108 comprises $V_{abc2}$ 126, the current phasor measured at first terminal 106 comprises $I_{abc1}$ 128, and the current phasor measured at second terminal 108 comprises $I_{abc2}$ 130. $V_{abc1}$ 124, $V_{abc2}$ 126, $I_{abc1}$ 128, and $I_{abc2}$ 130 may be timestamped and captured prior to and during fault 114 in order to identify synchronized voltage and current phasors at terminals 106, 108. Generally, $V_{abc}=$ $[V_a\ V_b\ V_c]$, where $V_a$, $V_b$, and $V_c$ are the measured phase voltage phasors. In other words, $V_{abc}$ is a matrix that includes all the measured phase voltage phasors. In like manner, $I_{abc}=[I_a\ I_b\ I_c]$, where $I_a$, $I_b$, and $I_c$ are the measured phase current phasors. In other words, $I_{abc}$ is a matrix that includes all the measured phase current phasors. This also applies to variations of $V_{abc}$ and $I_{abc}$ described herein (e.g., $V_{abc1}$, $V_{abc2}$, $I_{abc1}$, $I_{abc2}$, $I_{abc1(comp)}$, etc.).

In some embodiments, line segment 110 includes one or more tapped loads (not shown in FIG. 1). Further, distribution line 104 may include power generation at one or more terminals 106, 108 (e.g., power generation at one or more of terminals 106, 108).

During operation, fault detector 102 identifies synchronized voltage and current phasor information at terminals 106, 108 both prior to and during fault 114. For example, fault detector 102 identifies $V_{abc1}$ 124, $I_{abc1}$ 128 at first terminal 106, and identifies $V_{abc2}$ 126 and $I_{abc2}$ 130 at second terminal 108, prior to fault 114 and during fault 114. Fault detector 102 then calculates the equivalent sequence components for $V_{abc1}$ 124, $I_{abc1}$ 128, $V_{abc2}$ 126 and $I_{abc2}$ 130, where the equivalent sequence components comprise $V_{0+-1}$, $I_{0+-1}$, $V_{0+-2}$, $I_{0+-2}$, (0,+,−) represents the zero, positive, and negative sequence components for $V_{abc1}$ 124, $I_{abc1}$ 128, $V_{abc2}$ 126 and $I_{abc2}$ 130. respectively.

Fault detector 102 then determines whether fault 114 comprises a symmetrical fault or a non-symmetrical fault. For example, fault detector 102 determines whether fault comprises a symmetric fault or a non-symmetric fault based on the equivalent sequence components, $V_{0+-1}$, $I_{0+-1}$, $V_{0+-2}$, $I_{0+-2}$. A symmetric fault may occur when all phases are affected such that the system remains balanced. For example, a three-phase fault is a symmetrical fault. Other types of faults, such as a line to ground, a line to line, and/or a two line to ground faults comprise non-symmetrical faults. A non-symmetric fault may also be referred to as an unsymmetric or asymmetric fault.

Fault detector 102 may determine whether fault 114 is a symmetric fault or a non-symmetric fault in a number of different ways. In one embodiment, fault detector compares the positive sequence voltage $V_+$ and the negative sequence voltage V_ to determine if fault 114 is a symmetric fault or a non-symmetric fault. For example, fault detector 102 may compare the positive sequence voltage V_+ at first terminal 106 and/or second terminal 108 with its corresponding and/or opposite negative sequence voltage V_-, and determine that fault 114 is a symmetric fault if V_+>>V_-. For example, fault detector 102 may determine that fault 114 is a symmetric fault if V_+ is about one hundred times larger than V_-.

If fault detector 102 determines that fault 114 is a symmetric fault, then fault detector 102 may perform subsequent calculations using the positive sequence components $V_{+1}$, $I_{+1}$, $V_{+2}$, $I_{+2}$ in order to locate fault 114 along line segment 110, where $V_{+1}$ comprises the positive sequence voltage at first terminal 106, $I_{+1}$ comprises the positive sequence current at first terminal 106, $V_{+2}$ comprises the positive sequence voltage at second terminal 108, and $I_{+2}$ comprises the positive sequence current at second terminal 108.

Similarly, if fault detector 102 determines that fault 114 is a non-symmetric fault, then fault detector 102 may perform various calculations using the negative sequence components $V_{-1}$, $I_{-1}$, $V_{-2}$, $I_{-2}$ in order to locate fault 114 along line segment 110, where $V_{-1}$ comprises the negative sequence voltage at first terminal 106, $I_{-1}$ comprises the negative sequence current at first terminal 106, $V_{-2}$ comprises the negative sequence voltage at second terminal 108, and $I_{-2}$ comprises the negative sequence current at second terminal 108.

Figure 2:
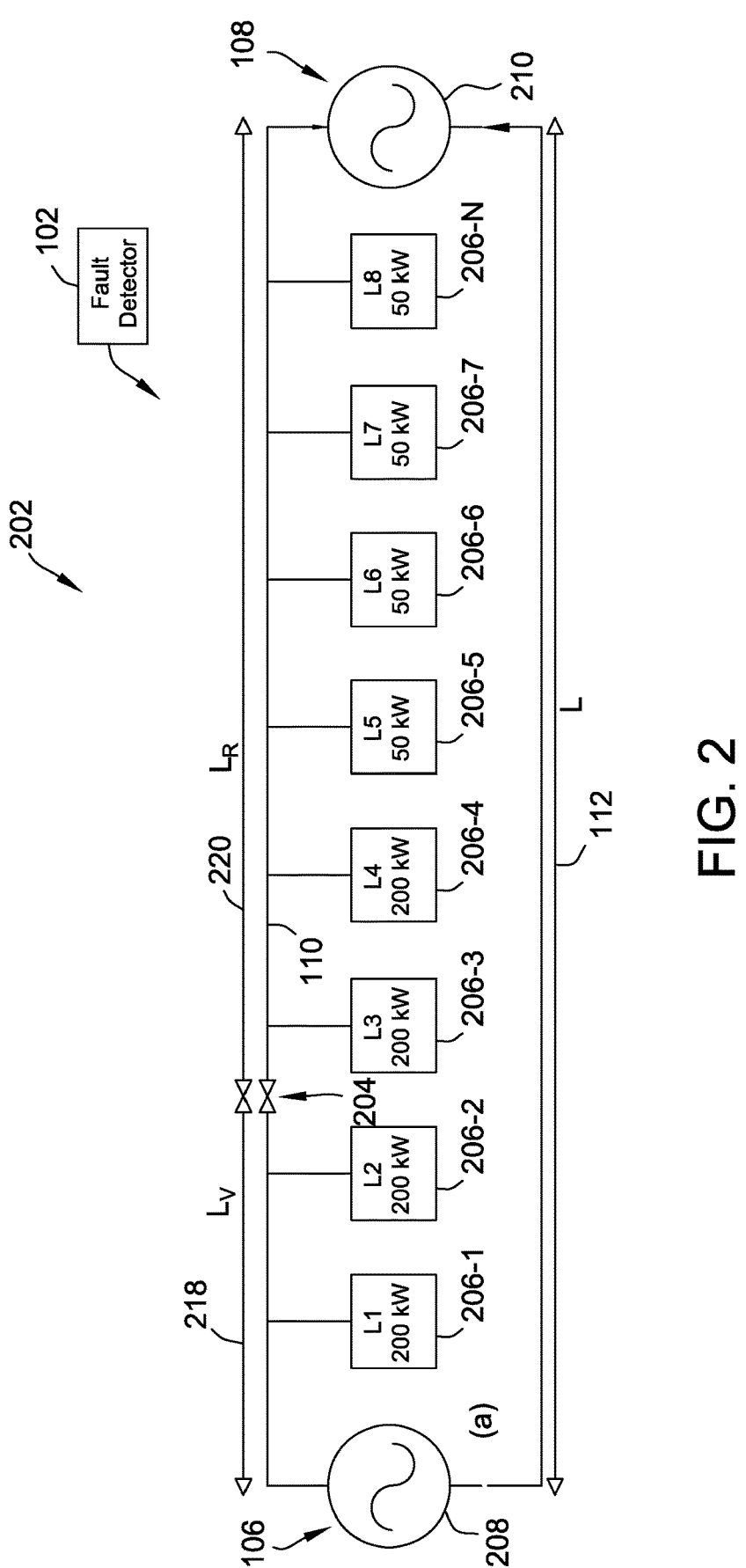
FIG. 2 depicts a load distribution graph of a distribution line in an exemplary embodiment.

In continuing with an analysis to locate fault 114, fault detector 102 calculates, identifies, and/or locates a virtual tap point for distribution line 104. FIG. 2 depicts a load distribution graph 202 of distribution line 104 in an exemplary embodiment. In FIG. 2, a virtual tap load point 204 divides line segment 110 at the point of virtual loading on distribution line 104 based on one or more tapped loads 206. Although eight tapped loads 206 are illustrated in FIG. 2, distribution line 104 may include more or fewer tapped loads 206 in other embodiments.

The location of virtual tap load point 204 along line segment 110 is based on the load distribution along line segment 110, and virtual tap load point 204 shifts left and right along line segment 110 based on the weighted values of the loads associated with tapped loads 206. In this embodiment, tapped loads 206-1, 206-2, 206-3, 206-4 are depicted as two hundred kilowatt (kw) loads and tapped loads 206-5, 206-6, 206-7, 206-N are depicted as fifty kw loads. However, tapped loads 206 may have other load values in other embodiments.

In some embodiments, the location of virtual tap load point 204 is calculated by fault detector 102. For example, fault detector 102 measures or identifies the loading at each of tapped loads 206, and based on the weighting of tapped loads 206 along line segment 110, calculates the location of virtual tap load point 204. In other embodiments, a load flow program is used to identify the location of virtual tap load point 204, and this information is provided to fault detector 102.

In this embodiment, load distribution graph 202 depicts a first equivalent power source 208 at first terminal 106 and a second equivalent power source 210 at second terminal 108, with virtual tap load point 204 disposed a distance ($L_V$) 218 away from first terminal 106 and first equivalent power source 208, and a distance ($L_R$) 220 away from second terminal 108 and second equivalent power source 210.

Figure 3:
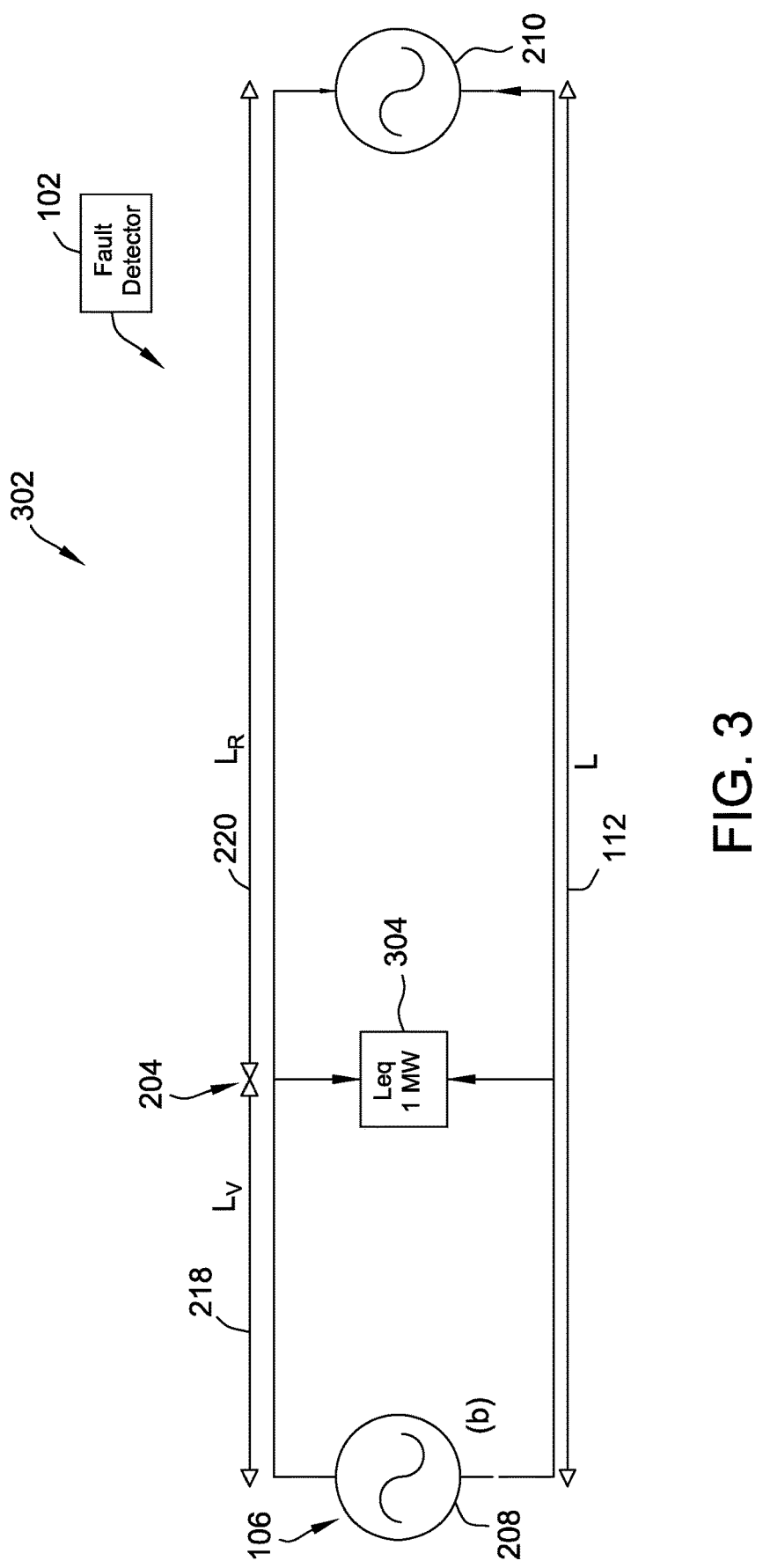
FIG. 3 depicts an equivalent load graph of the distribution line of FIG. 2 in an exemplary embodiment.

FIG. 3 depicts an equivalent load graph 302 of distribution line 104 in an exemplary embodiment. In this embodiment, virtual tap load point 204 includes a virtual load 304 of one-megawatt located at distance ($L_V$) 218 from first terminal 106 and at distance ($L_R$) 220 from second terminal 108. Distance ($L_V$) 218 and distance ($L_R$) 220 are based on the weighted distribution of tapped loads 206 along distribution line 104 (see FIG. 2), and virtual load 304 is a sum of tapped loads 206. However, in other embodiments, the location of virtual tap load point 204 relative to terminals 106, 108 and the value of virtual load 304 may be different depending on the distribution and loads associated with tapped loads 206.

Figure 4:
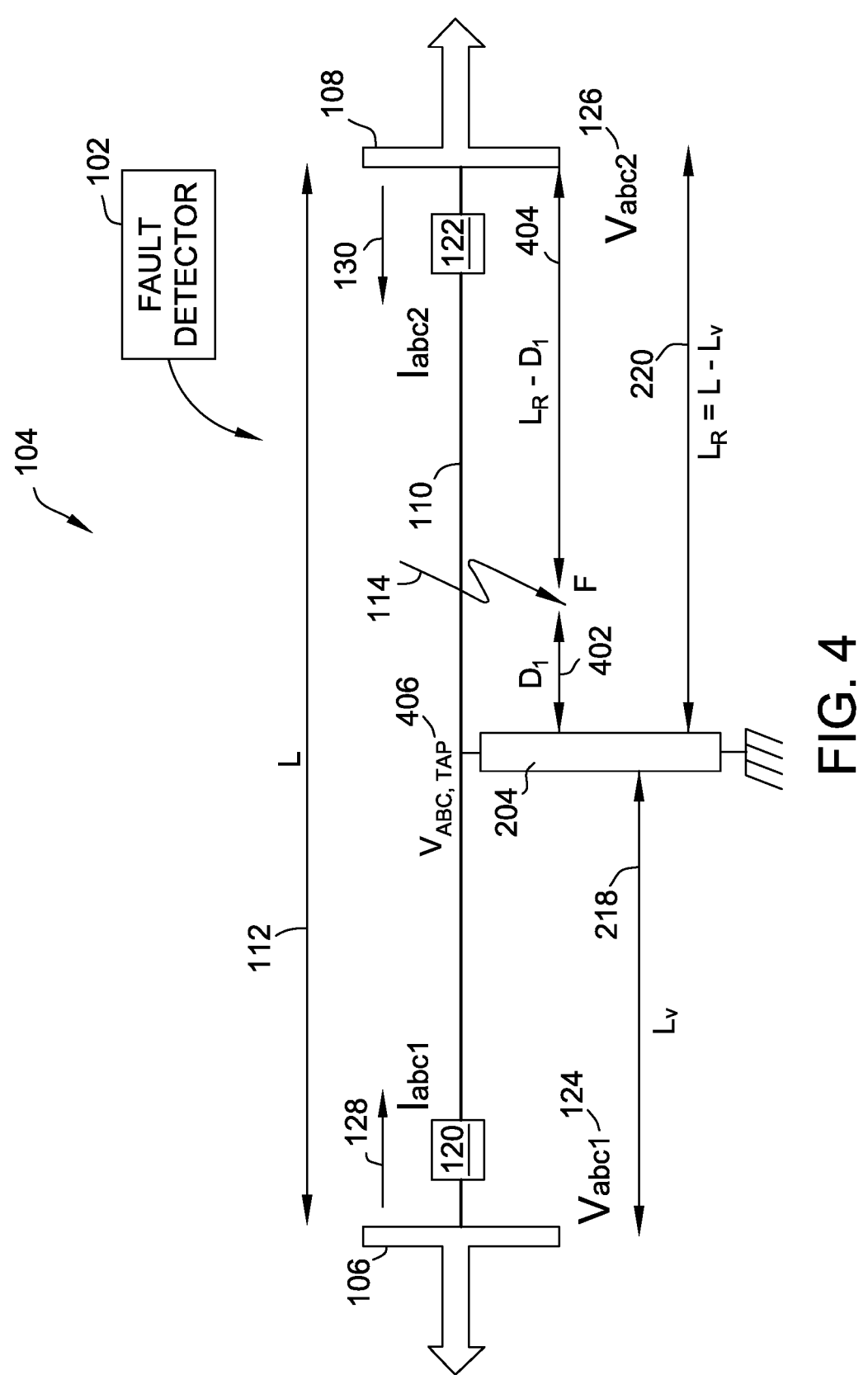
FIG. 4 depicts a first fault scenario for a distribution line in an exemplary embodiment.

FIG. 4 depicts a first fault scenario for distribution line 104 in an exemplary embodiment. In this embodiment, fault 114 is located between virtual tap load point 204 and second terminal 108. In particular, fault 114 is located at a distance ($D_1$) 402 from virtual tap load point 204 and at a distance ($L_R-D_1$) from second terminal 108. In this scenario, using distance ($L_V$) 218 of virtual tap load point 204 from first terminal 106 and the impedance of line segment 110, a voltage ($V_{abc,tap}$) 406 at virtual tap load point 204 is calculated and its equivalent symmetrical components are also calculated by fault detector 102 using the following equation:

$$V_{abc,tap} = V_{abc1} - L_V * Z_{abc} * I_{abc1(pre-fault)}, \quad \text{(eq. 1)}$$

where $V_{abc1}$ comprises voltage phasor $V_{abc1}$ 124 at first terminal 106 during fault 114, $L_V$ comprises distance ($L_V$) 218 between first terminal 106 and virtual tap load point 204, $Z_{abc}$ comprises an impedance of line segment 110 in an abc-domain, and $I_{abc1(pre-fault)}$ comprises current phasor $I_{abc1}$ 128 at first terminal 106 prior to fault 114. Generally, $Z_{abc}=[Z_a\ Z_b\ Z_c]$, where $Z_a$, $Z_b$, and $Z_c$ are positive sequence impedances of phases a, b, and c for line segment 110. In other words, $Z_{abc}$ is a matrix that includes the positive sequence impedances of all of the phases of line segment 110.

To calculate a compensated current ($I_{abc1(comp)}$) during fault 114 at first terminal 106 that compensates for the pre-fault loading conditions along line segment 110, fault detector utilizes the following equation:

$$I_{abc1(comp)} = I_{abc1(fault)} - (I_{abc1(pre-fault)} + I_{abc2(pre-fault)}), \quad \text{(eq. 2)}$$

where $I_{abc1(fault)}$ comprises current phasor $I_{abc1}$ 128 during fault 114, $I_{abc1(pre-fault)}$ comprises current phasor $I_{abc1}$ 128 prior to fault 114, and $I_{abc2(pre-fault)}$ comprises current phasor $I_{abc2}$ 130 prior to fault 114.

In response to calculating $I_{abc1(comp)}$, fault detector 102 calculates the equivalent sequence components of $I_{abc1(comp)}$, which is $I_{0+-1(comp)}$. $I_{01(comp)}$ is the zero-sequence component of $I_{abc1(comp)}$, $I_{+1(comp)}$ is the positive sequence component of $I_{abc1(comp)}$, and $I_{-1(comp)}$ is the negative sequence component of $I_{abc1(comp)}$.

At this point in the analysis of locating fault 114, fault detector 102 may perform different calculations depending on whether fault 114 is a symmetric fault or a non-symmetric fault. If fault 114 is a symmetric fault, then fault detector 102 may use the positive sequence components to calculate distance ($D_1$) 402 using the following equation:

$$D_1 = (V_{+,tap} - V_{+2} + L_R * Z_+ * I_{+2(fault)})/(Z_+ * (I_{+1(comp)} + I_{+2(fault)})), \quad \text{(eq. 3)}$$

where $V_{+,tap}$ comprises a positive sequence voltage of $V_{abc,tap}$ 406 during fault 114, $V_{+2}$ comprises the positive sequence of voltage phasor $V_{abc2}$ 126 at second terminal 108 during fault 114, $L_R$ comprises distance $(L_R)$ 220 between second terminal 108 and virtual tap load point 204, $Z_+$ comprises a positive sequence impedance of line segment 110, and $I_{+2(fault)}$ comprises a positive sequence of current phasor $I_{abc2}$ 130 at second terminal 108 during fault 114.

However, if fault 114 is a non-symmetric fault, then fault detector 102 may use the negative sequence components to calculate distance $(D_1)$ 402 using the following equation:

$$D_1 = (V_{-,tap} - V_{-2} + L_R * Z_+ * I_{-2(fault)})/(Z_+ * (I_{-1(comp)} + I_{-2(fault)})), \quad \text{(eq. 4)}$$

where $V_{-,tap}$ comprises a negative sequence voltage of $V_{abc,tap}$ 406 during fault 114, $V_{-2}$ comprises the negative sequence of voltage phasor $V_{abc2}$ 126 at second terminal 108 during fault 114, $L_R$ comprises distance $(L_R)$ 220 between second terminal 108 and virtual tap load point 204, $Z_+$ comprises a positive sequence impedance of line segment 110, $I_{-1(comp)}$ comprises the negative sequence component of $I_{abc1(comp)}$, and $I_{-2(fault)}$ comprises a negative sequence of current phasor $I_{abc2}$ 130 at second terminal 108 during fault 114.

In response to calculating distance $(D_1)$ 402 between virtual tap load point 204 and fault 114, fault detector 102 positively identifies the location of fault 114 along line segment 110 based on the relationships between distance $(D_1)$ 402, distance $(L_V)$ 218, distance $(L_R)$ 220, and distance $(L)$ 112.

Figure 5:
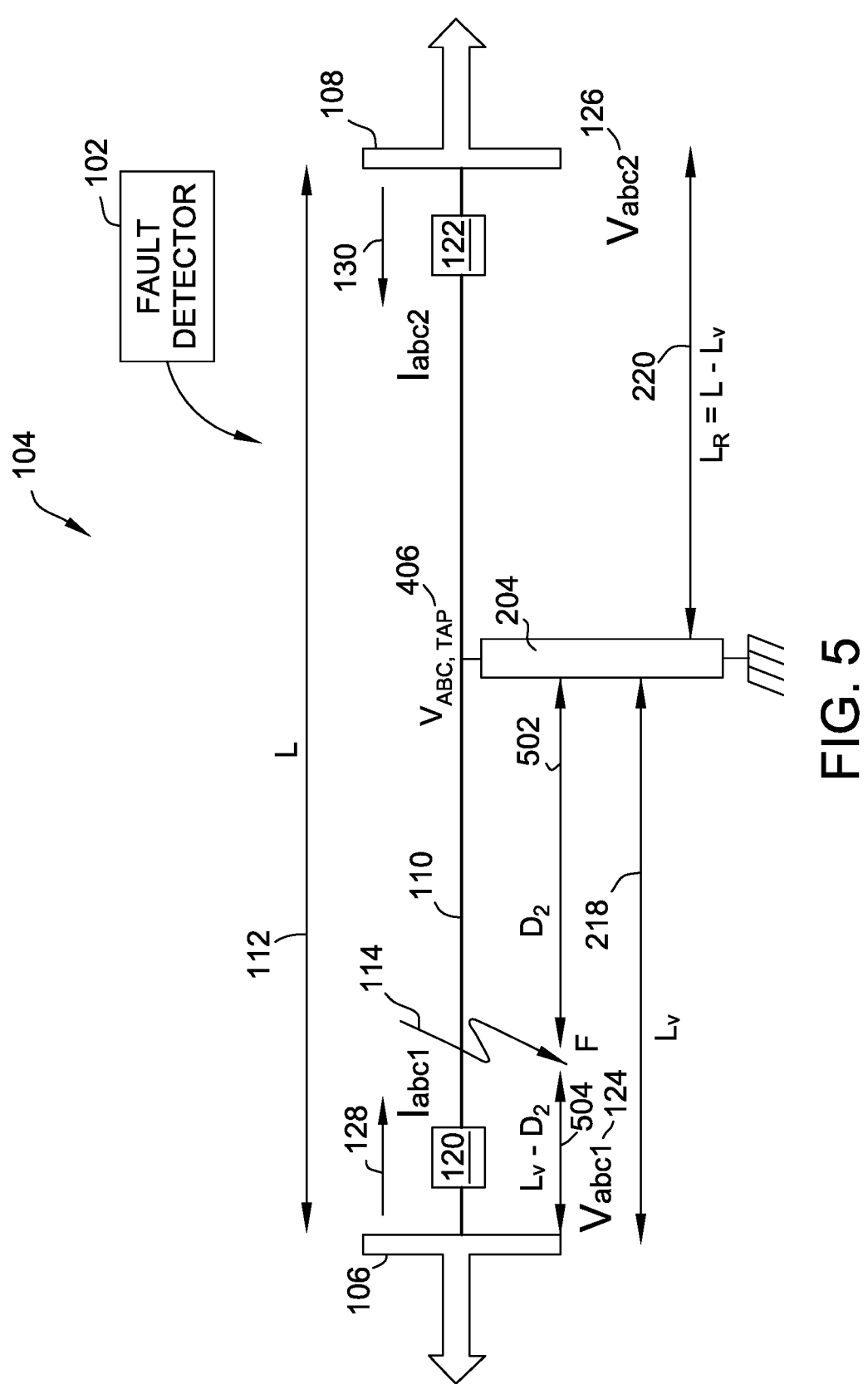
FIG. 5 depicts a second fault scenario for a distribution line in an exemplary embodiment.

FIG. 5 depicts a second fault scenario for distribution line 104 in an exemplary embodiment. In this embodiment, fault 114 is located between virtual tap load point 204 and first terminal 106. In particular, fault 114 is located at a distance $(D_2)$ 502 from virtual tap load point 204 and a distance $(L_V-D_2)$ 504 from first terminal 106. In the second scenario, using distance $(L_V)$ 218 of virtual tap load point 204 from first terminal 106 and the impedance of line segment 110, voltage $(V_{abc,tap})$ 406 at virtual tap load point 204 is calculated by fault detector 102 using the following equation:

$$V_{abc,tap} = V_{abc2} - L_R * Z_{abc} * I_{abc2(pre-fault)}, \quad \text{(eq. 5)}$$

where $V_{abc2}$ comprises voltage phasor $V_{abc2}$ 126 at second terminal 108 during fault 114, $L_R$ comprises distance $(L_R)$ 220 between second terminal 108 and virtual tap load point 204, $Z_{abc}$ comprises an impedance of line segment 110 in the abc-domain, and $I_{abc2(pre-fault)}$ comprises current phasor $I_{abc2}$ 130 at second terminal 108 prior to fault 114.

To calculate a compensated current $(I_{abc2(comp)})$ at second terminal 108 that compensates for the pre-fault loading conditions along line segment 110, fault detector 102 utilizes the following equation:

$$I_{abc2(comp)} = I_{abc2(fault)} - (I_{abc1(pre-fault)} + I_{abc2(pre-fault)}), \quad \text{(eq. 6)}$$

where $I_{abc2(fault)}$ comprises current phasor $I_{abc2}$ 130 at second terminal 108 during fault 114, $I_{abc1(pre-fault)}$ comprises current phasor $I_{abc1}$ 128 at first terminal 106 prior to fault 114, and $I_{abc2(pre-fault)}$ comprises current phasor $I_{abc2}$ 130 at second terminal 108 prior to fault 114.

In response to calculating $I_{abc2(comp)}$, fault detector 102 calculates the equivalent sequence components of $I_{abc2(comp)}$, which is $I_{0+-2(comp)}$. $I_{02(comp)}$ is the zero-sequence component of $I_{abc2(comp)}$, $I_{+2(comp)}$ is the positive sequence component of $I_{abc2(comp)}$, and $I_{-2(comp)}$ is the negative sequence component of $I_{abc2(comp)}$.

At this point in the analysis, fault detector 102 may perform different calculations depending on whether fault 114 is a symmetric fault or a non-symmetric fault. If fault 114 is a symmetric fault, then fault detector 102 may use the positive sequence components to calculate distance $(D_2)$ 402 using the following equation:

$$D_2 = (V_{+,tap} - V_{+1} + L_V * Z_+ * I_{+1(fault)})/(Z_+ * (I_{+1(fault)} + I_{+2(comp)})), \quad \text{(eq. 7)}$$

where $V_{+,tap}$ comprises a positive sequence voltage of $V_{abc,tap}$ 406 during fault 114, $V_{+1}$ comprises the positive sequence of voltage phasor $V_{abc1}$ 124 at first terminal 106 during fault 114, $L_V$ comprises distance $(L_V)$ 218 between first terminal 106 and virtual tap load point 204, $Z_+$ comprises a positive sequence impedance of line segment 110, $I_{+1(fault)}$ comprises a positive sequence of current phasor $I_{abc1}$ 128 at first terminal 106 during fault 114, and $I_{+2(comp)}$ comprises the positive sequence component of $I_{abc2(comp)}$.

However, if fault 114 is a non-symmetric fault, then fault detector 102 may use the negative sequence components to calculate distance $(D_2)$ 502 using the following equation:

$$D_2 = (V_{-,tap} - V_{-1} + L_V * Z_+ * I_{-1(fault)})/(Z_+ * (I_{-1(fault)} + I_{-2(comp)})), \quad \text{(eq. 8)}$$

where $V_{-,tap}$ comprises a negative sequence voltage of $V_{abc,tap}$ 406 during fault 114, $V_{-1}$ comprises the negative sequence of voltage phasor $V_{abc1}$ 124 at first terminal 106 during fault 114, $L_V$ comprises distance $(L_V)$ 218 between first terminal 106 and virtual tap load point 204, $Z_+$ comprises a positive sequence impedance of line segment, $I_{-1(fault)}$ comprises a negative sequence of current phasor $I_{abc1}$ 128 at first terminal 106 during fault 114, and $I_{-2(comp)}$ comprises the negative sequence component of $I_{abc2(comp)}$.

In response to calculating distance $(D_2)$ 502 between virtual tap load point 204 and fault 114, fault detector 102 positively identifies the location of fault 114 along line segment 110 based on the relationships between distance $(D_2)$ 502, distance $(L_V)$ 218, distance $(L_R)$ 220, and distance $(L)$ 112.

In some embodiments, fault detector 102 determines whether to use distance $(D_1)$ 402 and/or distance $(D_2)$ 502 to find the location of fault 114 using one or more criteria. For example, if distance $(D_1)$ 402>zero, then fault detector 102 may determine that fault 114 is at distance $(L_V)$ 218+ distance $(D_1)$ 402 from first terminal 106 (see FIG. 4). If distance $(D_2)$ 502>zero, then fault detector 102 may determine that fault 114 is at a distance $(L_V)$ 218– distance $(D_2)$ 502 from first terminal 106 (see FIG. 5).

Figure 6:
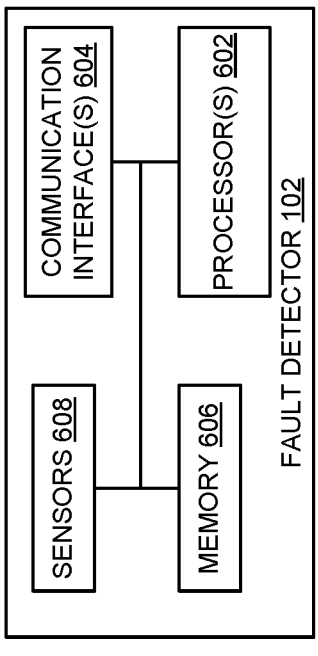
FIG. 6 depicts a block diagram of a fault detector in an exemplary embodiment.

FIG. 6 depicts a block diagram of fault detector 102 in an exemplary embodiment. In this embodiment, fault detector 102 comprises at least one processor 602, at least one communication interface 604, at least one memory 606, and one or more sensors 608. Memory 606 may store, for example, programed instructions which, when executed by processor 602, directs fault detector 102 to perform any of the functions previously described herein for fault detector 102. Some examples of communication interface 604 include serial interfaces, parallel interfaces, Wi-Fi interfaces, cellular network interfaces, etc.

In some embodiments, fault detector 102 may be communicatively coupled to relays 120, 122 via communication interfaces 604, when relays 120, 122 measure $V_{abc1}$ 124 and $I_{abc1}$ 128 at first terminal 106, and measure $V_{abc2}$ 126 and $I_{abc2}$ 130 at second terminal 108. In other embodiments, fault detector 102 may be communicatively coupled to one or more measurement systems, not shown, via communication interfaces 604, and the one or more measurement systems measure $V_{abc1}$ 124 and $I_{abc1}$ 128 at first terminal 106, and also measure $V_{abc2}$ 126 and $I_{abc2}$ 130 at second terminal 108.

In some embodiments, fault detector 102 utilizes sensors 608 to measure $V_{abc1}$ 124 and $I_{abc1}$ 128 at first terminal 106, and measure $V_{abc2}$ 126 and $I_{abc2}$ 130 at second terminal 108. However, in other embodiments, fault detector 102 may utilize combinations of sensors 608 to obtain $V_{abc1}$ 124 and $I_{abc1}$ 128 at first terminal 106, and obtain $V_{abc2}$ 126 and $I_{abc2}$ 130 at second terminal 108 and/or may communicate with relays 120, 122 and/or external measurement systems via communication interfaces 604 to obtain $V_{abc1}$ 124 and $I_{abc1}$ 128 at first terminal 106, and obtain $V_{abc2}$ 126 and $I_{abc2}$ 130 at second terminal 108.

Figure 7:
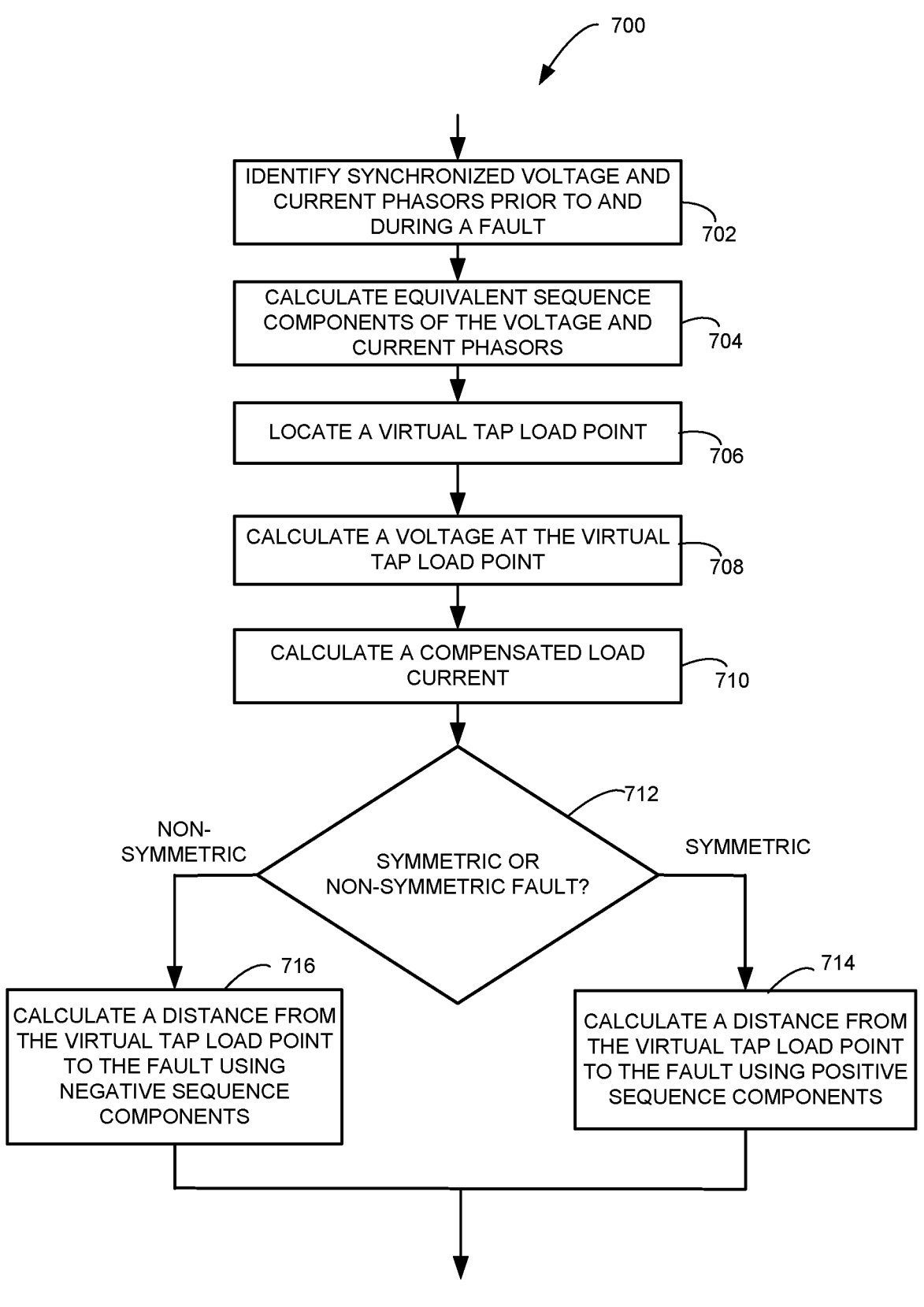
FIG. 7 depicts a flow chart of a method of detecting a location of a fault in a tapped power distribution line in an exemplary embodiment.

FIG. 7 depicts a flow chart of a method 700 of detecting a location of a fault in a tapped power distribution line in an exemplary embodiment. The power distribution line has a first terminal, a second terminal, and a line segment disposed therebetween. Method 700 will be discussed with respect to fault detector 102 and FIGS. 1-6, although method 700 may be performed by other systems, not shown.

In this embodiment, method 700 comprises identifying 702 synchronized voltage phasors and current phasors at the first terminal and the second terminal prior to and during the fault. In one example, processor 602 utilizes sensors 608 to measure $V_{abc1}$ 124 and $I_{abc1}$ 128 at first terminal 106 and measure $V_{abc2}$ 126 and $I_{abc2}$ 130 at second terminal 108 (see FIGS. 1 and 6). In another example, processor 602 utilizes communication interface 604 to obtain $V_{abc1}$ 124 and $I_{abc1}$ 128 at first terminal 106 and measure $V_{abc2}$ 126 and $I_{abc2}$ 130 at second terminal 108, from, for example, relays 120, 122 and/or external measurement systems.

Method 700 further comprises calculating 704 equivalent sequence components for the voltage phasors and the current phasors. For example, processor 602 calculates the equivalent sequence components (0,+,−) for $V_{abc1}$ 124, $I_{abc1}$ 128, $V_{abc2}$ 126, and $I_{abc2}$ 130 prior to and during the fault.

Method 700 further comprises locating 706 a virtual tap point on the line segment. For example, processor 602 locates virtual tap load point 204 (see FIGS. 2-5). Processor 602 may, for example, calculate virtual tap load point 204 using information regarding tapped loads 206 (see FIG. 2). In another example, processor 602 communicates with external systems (e.g., via communication interface 604) to identify information about virtual tap load point 204 and/or tapped loads 206.

Method 700 further comprises calculating 708 a voltage at the virtual tap load point based on one or more of the current phasors prior to the fault. For example, processor 602 utilizes eq. 1 and/or eq. 5 to calculate $V_{abc,tap}$ of virtual tap load point 204.

Method 700 further comprises calculating 710 a compensated load current at the first terminal and/or the second terminal based on one or more of the current phasors prior to and/or after the fault. For example, processor 602 utilizes eq. 2 and/or eq. 6 to calculate the compensated load current.

Method 700 further comprises determining 712, based on the equivalent sequence components, whether the fault comprises a symmetric fault or a non-symmetric fault. For example, processor 602 determines whether fault 114 is a symmetric fault or a non-symmetric fault by, for example, comparing positive sequence voltages and negative sequence voltages at terminal 106 and/or terminal 108.

If the fault is symmetric, then method 700 further comprises calculating 714 a distance from the virtual tap load point to the fault using the positive sequence components. For example, processor 602 utilizes eq. 3 and/or eq. 7 to calculate the distance.

However, if the fault is non-symmetric, then method 700 further comprises calculating 716 the distance from the virtual tap load point to the fault using the negative sequence components. For example, processor 602 utilizes eq. 4 and/or eq. 8 to calculate the distance.

Figure 8:
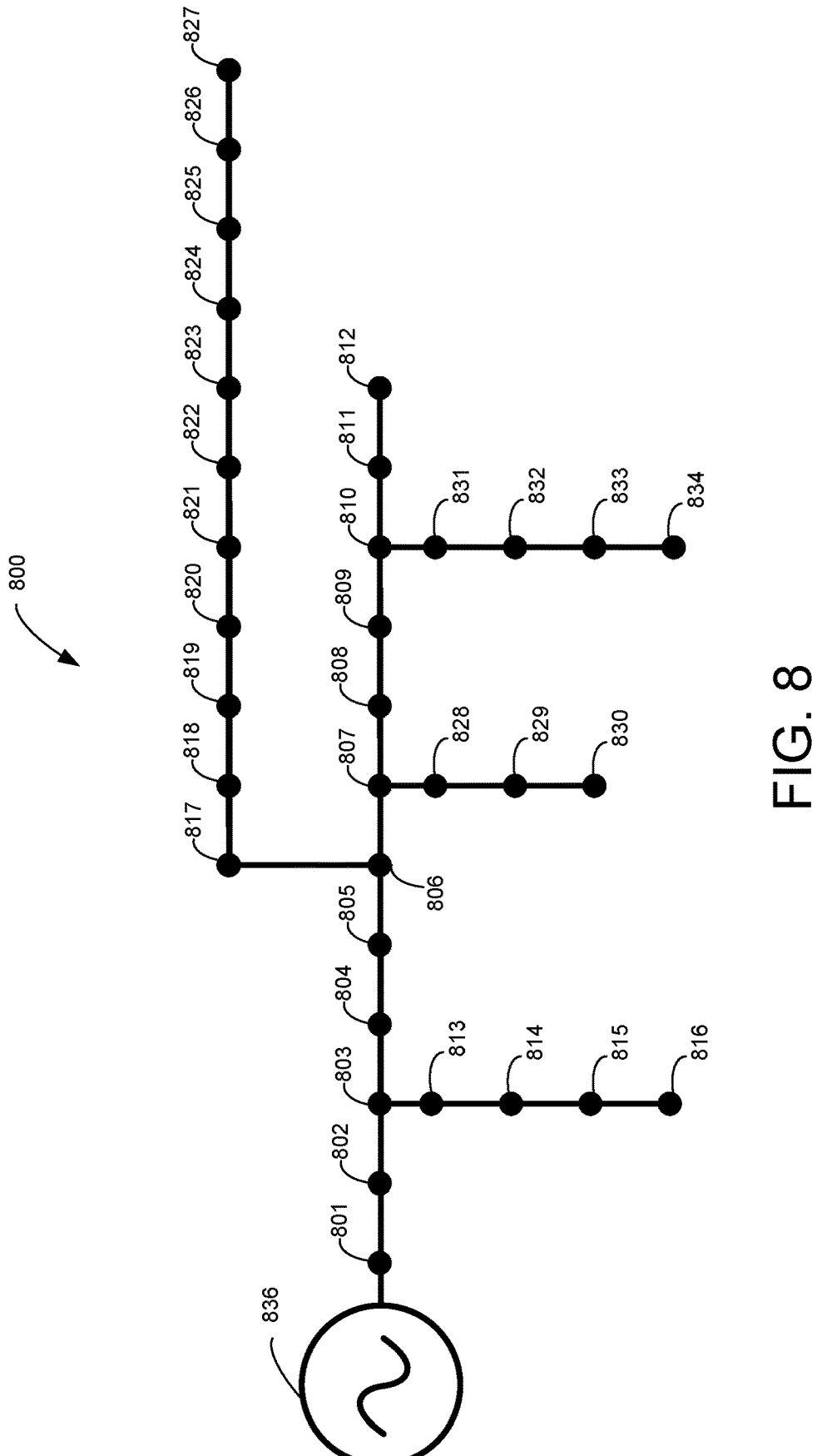
FIG. 8 depicts a power distribution network in an exemplary embodiment.

FIG. 8 depicts a power distribution network 800 in an exemplary embodiment. In this embodiment, power distribution network 800 includes a plurality of busses 801-834 powered by source 836, and power distribution network 800 has interconnection points at bus 803, bus 806, bus 807, and bus 810. While locating faults in power distribution network 800 using prior techniques may be difficult, locating faults in power distribution network 800 is improved using the embodiments described herein by sub-dividing power distribution network 800 into sections of point-to-point protected zone. In one embodiment, central controllers and/or relays such as SSC600's or REX640's from ABB may be used to obtain information from two of busses 801-834 on either end of a protected zone. While it may be challenging to evaluation faults in power distribution network 800 using data only at bus 801 and bus 812, a more precise fault location detection scheme is described below with respect to zones.

Zone 1: bus 801 to bus 806, SMVRECEIVE1: Bus 801, SMVRECEIVE2: bus 806.

Zone 2: bus 807 to bus 812, SMVRECEIVE3: Bus 807, SMVRECEIVE4: bus 812.

Zone 3: bus 813 to bus 816, SMVRECEIVE5: Bus 813, SMVRECEIVE6: bus 816.

Zone 4: bus 817 to bus 827, SMVRECEIVE7: Bus 813, SMVRECEIVE8: bus 827.

Zone 5: bus 831 to bus 834, SMVRECEIVE9: Bus 831, SMVRECEIVE10: bus 834.

By utilizing advanced group settings, the sample measured value ID (SMV-ID) of each bus 801-834 can be identified, and buses 801-834 of power distribution network 800 can be sectionalized into smaller zones. In this format, up to five zones can be made with two unique SMV-IDs, along with the sectional line length for each zone. A central controller such as the SCC600 can automatically identify the faulted zone and assign the correct SMV streams to the three-phase voltage and current inputs of this function block when triggered. If a controller does not have the ability to identify a faulted section, then in another embodiment, the fault location calculations described previously can be iteratively applied, once per zone, in order to identify the section with a logical value (positive, but smaller than the line) for either $D_1$ or $D_2$. Inherent in these calculations is the overshoot of D1 or D2 if the fault is outside of the section being analyzed, such that detecting the fault is limited to the zone being currently evaluated. With only the actively faulted zone isolated and involved in the calculations, this technique minimizes demand disruption and enhances the reliability of power distribution network 800 during a fault.

These types of calculations also accommodate double infeed distribution systems, where two of busses 801-834 on either end of a protected zone are sourcing power. The measurements from any two of busses 801-834 having only loads in between will result in a more precise calculation within the protected zone as compared to a single-ended algorithm. When sources are SMV tagged, a protection function can be applied to sectionalize power distribution network 800 into point-to-point zones, with only the actively faulted zone involved in the calculations.

The embodiments described herein provide for robust fault location mechanisms that utilize synchronized voltage and current phasor information at ends of a distribution line, along with virtual tap load point information, in order to quickly and reliably locate faults.

An example technical effect of the embodiments described herein includes at least one of: (a) fault location mechanisms described herein work for different types of faults without the need to know the zero-sequence impedance of the distribution line, among other uncertain parameters; (b) the fault location mechanisms described herein work on distribution systems with tapped loads without the need to know the physical location of the tapped loads; (c) the fault location mechanisms described herein work for radial, meshed, and ring networks as well as for different grounding configurations; and (d) the fault location mechanisms described herein utilize synchronization techniques that have become more common in electrical distribution systems, with timestamped voltage and current phasors accurate to a few microseconds possible.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system for detecting a location of a fault in a tapped power distribution line having a first terminal, a second terminal, and a line segment disposed therebetween, the system comprising:

a first relay electrically connected to the first terminal and configured to measure a first voltage phasor and a first current phasor at the first terminal;

a second relay electrically connected to the second terminal and configured to measure a second voltage phasor and a second current phasor at the second terminal; and a fault detector comprising:

a communication interface communicatively coupled with the first and second relays; and at least one processor communicatively coupled to the communication interface and configured to:

retrieve, utilizing the communication interface from the first and second relays, synchronized measurements of the first and second voltage phasors and synchronized measurements of the first and second current phasors as measured by the first and second relays, respectively, prior to and during the fault;

calculate equivalent sequence components for the first and second voltage phasors and the first and second current phasors;

locate a virtual tap load point on the line segment;

calculate a voltage at the virtual tap load point based on one or more of the first and second current phasors prior to the fault;

calculate a compensated load current at the first terminal and/or the second terminal based on one or more of the first and second current phasors prior to and/or after the fault; and calculate a distance from the virtual tap load point to the fault based on the voltage at the virtual tap load point, the compensated load current, and one or more of the equivalent sequence components to detect the location of the fault.

2. The system of claim 1, wherein:

the at least one processor is further configured to:

determine, based on the equivalent sequence components, whether the fault comprises a symmetric fault or a non-symmetric fault;

calculate the distance using positive sequence components of the equivalent sequence components in response to determining that the fault comprises the symmetric fault; and calculate the distance using negative sequence components of the equivalent sequence components in response to determining that the fault comprises the non-symmetric fault.

3. The system of claim 2, wherein:

the fault is located between the virtual tap load point and the second terminal at a distance D1 from the virtual tap load point, the voltage at the virtual tap load point comprises Vabc, tap, $$V_{abc,tap} = V_{abc1} - L_v * Z_{abc} * I_{abc1(pre-fault)},$$

and

Vabc1 comprises the first voltage phasor measured by the first relay at the first terminal during the fault, Lv comprises a distance between the first terminal and the virtual tap load point, Zabc comprises an impedance of the line segment in an abc-domain, and Iabc1(pre-fault) comprises the first current phasor measured by the first relay at the first terminal prior to the fault.

4. The system of claim 3, wherein:

the compensated load current comprises Iabc1(comp), $$I_{abc1(comp)} = I_{abc1(fault)} - (I_{abc1(pre-fault)} + I_{abc2(pre-fault)}),$$

and

Iabc1(fault) comprises the first current phasor measured by the first relay at the first terminal during the fault, Iabc1(pre-fault) comprises the first current phasor measured by the first relay at the first terminal prior to the fault, and Iabc2(pre-fault) comprises the second current phasor measured by the second relay at the second terminal prior to the fault.

5. The system of claim 4, wherein:

the fault comprises the symmetric fault, $$D_1 = (V_{+,tap} - V_{+2} + L_R * Z_+ * I_{+2(fault)})/(Z_+ * (I_{+1(comp)} + I_{+2(fault)})),$$

and

V+,tap comprises a positive sequence voltage of Vabc,tap during the fault, V+2 comprises a positive sequence voltage of the second voltage phasor measured by the second relay at the second terminal during the fault, LR comprises a distance between the second terminal and the virtual tap load point, Z+ comprises a positive sequence impedance of the line segment, I+2(fault) comprises a positive sequence current of the second current phasor measured by the second relay at the second terminal during the fault, and I+1(comp) comprises an equivalent positive sequence current of Iabc1 (comp).

6. The system of claim 4, wherein:

the fault comprises the non-symmetric fault, and $$D_1 = (V_{-,tap} - V_{-2} + L_R * Z_+ * I_{-2(fault)})/(Z_+ * (I_{-1(comp)} + I_{-2(fault)})),$$

and

V−,tap comprises a negative sequence voltage of Vabc,tap during the fault, V−2 comprises a negative sequence voltage of the second voltage phasor measured by the second relay at the second terminal during the fault, LR comprises a distance between the second terminal and the virtual tap load point, Z+ comprises a positive sequence impedance of the line segment, I−2(fault) comprises a negative sequence current of the second current phasor measured by the second relay at the second terminal during the fault, and I−1(comp) comprises an equivalent negative sequence current of Iabc1 (comp).

7. The system of claim 2, wherein:

the fault is located between the virtual tap load point and the first terminal at a distance D2 from the virtual tap load point, the voltage at the virtual tap load point comprises Vabc, tap, $$V_{abc,tap} = V_{abc2} - L_r * Z_{abc} * I_{abc2(pre-fault)},$$

and

Vabc2 comprises the second voltage phasor measured by the second relay at the second terminal during the fault, Lr comprises a distance between the second terminal and the virtual tap load point, Zabc comprises an impedance of the line segment in an abc-domain, and Iabc2(pre-fault) comprises the second current phasor measured by the second relay at the second terminal prior to the fault.

8. The system of claim 7, wherein:

the compensated load current comprises Iabc2(comp), $$I_{abc2(comp)} = I_{abc2(fault)} - (I_{abc1(pre-fault)} + I_{abc2(pre-fault)}),$$

and

Iabc2(fault) comprises the second current phasor measured by the second relay at the second terminal during the fault, Iabc1(pre-fault) comprises the first current phasor measured by the first relay at the first terminal prior to the fault, and Iabc2(pre-fault) comprises the second current phasor measured by the second relay at the second terminal prior to the fault.

9. The system of claim 8 wherein:

the fault comprises the symmetric fault, and $$D_2 = (V_{+,tap} - V_{+1} + L_v * Z_+ * I_{+1(fault)})/(Z_+ * (I_{+1(fault)} + I_{+2(comp)})),$$

and

V+,tap comprises a positive sequence voltage of Vabc,tap during the fault, V+1(fault) comprises a positive sequence voltage of the first voltage phasor measured by the first relay at the first terminal during the fault, Lv comprises a distance between the first terminal and the virtual tap load point, Z+ comprises a positive sequence impedance of the line segment, I+1(fault) comprises a positive sequence current of the first current phasor measured by the first relay at the first terminal during the fault, and I+2(comp) comprises an equivalent positive sequence current of Iabc2(comp).

10. The system of claim 8, wherein:

the fault comprises the non-symmetric fault, $$D_2 = (V_{-,tap} - V_{-1} + L_v * Z_+ * I_{-1(fault)})/(Z_+ * (I_{-1(fault)} + I_{-2(comp)})),$$

and

V−,tap comprises a negative sequence voltage of Vabc,tap during the fault, V−1(fault) comprises a negative sequence voltage of the first voltage phasor measured by the first relay at the first terminal during the fault, Lv comprises a distance between the first terminal and the virtual tap load point, Z+ comprises a positive sequence impedance of the line segment, I−1(fault) comprises a negative sequence current of the first current phasor measured by the first relay at the first terminal during the fault, and I−2(comp) comprises an equivalent negative sequence current of Iabc2(comp).

11. A method operable by at least one processor of a fault detector of system for detecting a location of a fault in a tapped power distribution line having a first terminal, a second terminal, and a line segment disposed therebetween, wherein:

the system comprises:

a first relay electrically connected to the first terminal and configured to measure a first voltage phasor and a first current phasor at the first terminal;

a second relay electrically connected to the second terminal and configured to measure a second voltage phasor and a second current phasor at the second terminal; and a fault detector comprising:

a communication interface communicatively coupled with the first and second relays; and the least one processor communicatively coupled to the communication interface, the method comprising:

retrieving, utilizing the communication interface from the first and second relays, synchronized first and second voltage phasors and synchronized first and second current phasors measured by the first and second relays, respectively, prior to and during the fault;

calculating equivalent sequence components for the first and second voltage phasors and the first and second current phasors;

locate a virtual tap load point on the line segment;

calculating a voltage at the virtual tap load point based on one or more of the first and second current phasors prior to the fault;

calculating a compensated load current at the first terminal and/or the second terminal based on one or more of the first and second current phasors prior to and/or after the fault; and calculating a distance from the virtual tap load point to the fault based on the voltage at the virtual tap load point, the compensated load current, and one or more of the equivalent sequence components to detect the location of the fault.

12. The method of claim 11, further comprising:

determining, based on the equivalent sequence components, whether the fault comprises a symmetric fault or a non-symmetric fault;

calculating the distance using positive sequence components of the equivalent sequence components in response to determining that the fault comprises the symmetric fault; and calculating the distance using negative sequence components of the equivalent sequence components in response to determining that the fault comprises the non-symmetric fault.

13. The method of claim 12, wherein:

the fault is located between the virtual tap load point and the second terminal at a distance D1 from the virtual tap load point, the voltage at the virtual tap load point comprises Vabc, tap, $$V_{abc,tap} = V_{abc1} - L_v * Z_{abc} * I_{abc1(pre-fault)},$$

and

Vabc1 comprises the first voltage phasor measured by the first relay at the first terminal during the fault, Lv comprises a distance between the first terminal and the virtual tap load point, Zabc comprises an impedance of the line segment in an abc-domain, and Iabc1(pre-fault) comprises the first current phasor measured by the first relay at the first terminal prior to the fault.

14. The method of claim 13, wherein:

the compensated load current comprises Iabc1(comp), $$I_{abc1(comp)} = I_{abc1(fault)} - (I_{abc1(pre-fault)} + I_{abc2(pre-fault)}),$$

and

Iabc1(fault) comprises the first current phasor measured by the first relay at the first terminal during the fault, Iabc1(pre-fault) comprises the first current phasor measured by the first relay at the first terminal prior to the fault, and Iabc2(pre-fault) comprises the second current phasor measured by the second relay at the second terminal prior to the fault.

15. The method of claim 14, wherein:

the fault comprises the symmetric fault, $$D_1 = (V_{+,tap} - V_{+2} + L_R * Z_+ * I_{+2(fault)})/(Z_+ * (I_{+1(comp)} + I_{+2(fault)})),$$

and

V+,tap comprises a positive sequence voltage of Vabc,tap during the fault, V+2 comprises a positive sequence voltage of the second voltage phasor measured by the second relay at the second terminal during the fault, LR comprises a distance between the second terminal and the virtual tap load point, Z+ comprises a positive sequence impedance of the line segment, I+2(fault) comprises a positive sequence current of the second current phasor measured by the second relay at the second terminal during the fault, and I+1(comp) comprises an equivalent positive sequence current of Iabc1 (comp).

16. The method of claim 14, wherein:

the fault comprises the non-symmetric fault, and $$D_1 = (V_{-,tap} - V_{-2} + L_R * Z_+ * I_{-2(fault)})/(Z_+ * (I_{-1(comp)} + I_{-2(fault)})),$$

and

V−,tap comprises a negative sequence voltage of Vabc,tap during the fault, V−2 comprises a negative sequence voltage of the second voltage phasor measured by the second relay at the second terminal during the fault, LR comprises a distance between the second terminal and the virtual tap load point, Z+ comprises a positive sequence impedance of the line segment, I−2(fault) comprises a negative sequence current of the second current phasor measured at the second terminal during the fault, and I−1(comp) comprises an equivalent negative sequence current of Iabc1(comp).

17. The method of claim 12, wherein:

the fault is located between the virtual tap load point and the first terminal at a distance D2 from the virtual tap load point, the voltage at the virtual tap load point comprises Vabc, tap, $$V_{abc,tap} = V_{abc2} - L_r * Z_{abc} * I_{abc2(pre-fault)},$$

and

Vabc2 comprises the second voltage phasor measured by the second relay at the second terminal during the fault, Lr comprises a distance between the second terminal and the virtual tap load point, Zabc comprises an impedance of the line segment in an abc-domain, and Iabc2(pre-fault) comprises the second current phasor measured by the second relay at the second terminal prior to the fault.

18. The method of claim 17, wherein:

the compensated load current comprises Iabc2(comp), $$I_{abc2(comp)} = I_{abc2(fault)} - (I_{abc1(pre-fault)} + I_{abc2(pre-fault)}),$$

17

Iabc2(fault) comprises the second current phasor measured by the second relay at the second terminal during the fault, Iabc1(pre-fault) comprises the first current phasor measured by the first relay at the first terminal prior to the fault, and Iabc2(pre-fault) comprises the second current phasor measured by the second relay at the second terminal prior to the fault.

19. The method of claim 18 wherein:

the fault comprises the symmetric fault, and $$D_2 = (V_{+,tap} - V_{+1} + L_v * Z_+ * I_{+1(fault)})/(Z_+ * (I_{+1(fault)} + I_{+2(comp)})),$$

and

V+,tap comprises a positive sequence voltage of Vabc,tap during the fault, V+1(fault) comprises a positive sequence voltage of the first voltage phasor measured by the first relay at the first terminal during the fault, Lv comprises a distance between the first terminal and the virtual tap load point, Z+ comprises a positive sequence impedance of the line segment, I+1(fault) comprises a positive sequence current of the first current phasor measured by the first relay at the first terminal during the fault, and I+2(comp) comprises an equivalent positive sequence current of Iabc2(comp).

20. The method of claim 18, wherein:

the fault comprises the non-symmetric fault, $$D_2 = (V_{-,tap} - V_{-1} + L_v * Z_+ * I_{-1(fault)})/(Z_+ * (I_{-1(fault)} + I_{-2(comp)})),$$

and

V−,tap comprises a negative sequence voltage of Vabc,tap during the fault, V−1(fault) comprises a negative sequence voltage of the first voltage phasor measured by the first relay at the first terminal during the fault, Lv comprises a distance between the first terminal and the virtual tap load point, Z+ comprises a positive sequence impedance of the line segment, I−1(fault) comprises a negative sequence current of the first current phasor measured by the first relay at the first terminal during the fault, and I−2(comp) comprises an equivalent negative sequence current of Iabc2(comp).

\* \* \* \* \*